(12) United States Patent
Kuroda

(10) Patent No.: US 6,509,798 B2
(45) Date of Patent: Jan. 21, 2003

(54) VARIABLE GAIN AMPLIFIER

(75) Inventor: Hidehiko Kuroda, Tokyo (JP)

(73) Assignee: NEC Compound Semiconductor Devices Ltd. (JP)

( * ) Notice: Subject to any disclaimer, the term of this patent is extended or adjusted under 35 U.S.C. 154(b) by 0 days.

(21) Appl. No.: 09/888,179

(22) Filed: Jun. 22, 2001

(65) Prior Publication Data

US 2002/0008582 A1 Jan. 24, 2002

(30) Foreign Application Priority Data

Jul. 24, 2000 (JP) ........................................ 2000-222705

(51) Int. Cl.[7] ................................................ H03G 3/10
(52) U.S. Cl. ........................................ 330/278; 330/254
(58) Field of Search ................................ 330/254, 228, 330/311; 327/359

(56) References Cited

U.S. PATENT DOCUMENTS

| 4,344,043 A | * | 8/1982 | Harford | 330/254 |
| 5,999,058 A | * | 12/1999 | Fong | 330/278 |
| 6,043,710 A | * | 3/2000 | Smith et al. | 327/359 |
| 6,046,641 A | * | 4/2000 | Chawla et al. | 330/269 |
| 6,181,206 B1 | * | 1/2001 | Palmisano et al. | 330/278 |
| 6,249,153 B1 | * | 6/2001 | Moraveji | 327/563 |

FOREIGN PATENT DOCUMENTS

| JP | 4-74010 | 3/1992 | ............ H03G/7/00 |
| WO | WO 95/07574 | 3/1995 | ............ H03G/7/00 |

* cited by examiner

*Primary Examiner*—Robert Pascal
*Assistant Examiner*—Khanh Van Nguyen
(74) *Attorney, Agent, or Firm*—Hayes Soloway PC

(57) ABSTRACT

The variable gain amplifier includes a parallel connection of resistance R2 and capacitor C2. Resistance R2 may be replaced by inductance L, and bipolar transistors may be replaced by other types such MOS transistors. Resistance R2 gives a current feedback for transistor Q2, thereby lowering the mutual conductance "gm" of transistor Q2, and limiting the current flowing from voltage supply V0. The emitter area ratio (the emitter area of transistor Q2: the emitter area of Q3) made to be 1: n where "n" is greater than or equal to 1, thereby controlling each current. Capacitor C2 is connected in parallel with R2 connected with the base of transistor Q2 is a bypass capacitor for lowering the impedance of the base of transistor Q2 in higher frequency range. Capacitor C2 is a peaking capacitor, because it improves the high frequency characteristics.

5 Claims, 5 Drawing Sheets

VARIABLE GAIN AMPLIFIER

BACKGROUND OF THE INVENTION

1. Technical Field of the Invention

The present invention relates to a variable gain amplifier and particularly to a variable gain amplifier which includes a parallel connection of a resistance and a capacitor, or a parallel connection of an inductance and a capacitor.

2. Description of the Prior Art

Cascade amplifiers are employed for amplifying radio frequency signals for the pocket telephones and information terminals. Further, the cascade amplifiers are often provided with means for obtaining variable gain.

FIG. 4 is a block diagram of a conventional variable gain cascade amplifier. The amplifier as shown in FIG. 4 comprises a cascade amplifier including common-emitter transistor Q0 and common-base transistor Q1, a variable gain unit including transistor Q2 and Q3 and resistance R2, resistance R0 for applying bias V3 to the base of transistor Q0, resistance R1 for the load resistance of the cascade amplifier, voltage supply V2 for the amplifier as a whole, voltage supply V0 (voltage supply 50) for controlling the gain of the variable gain unit, signal input terminal 10, signal output terminal 40, power supplies and coupling capacitors connected with signal input terminal 10 and signal output terminal 40, respectively.

The variable gain cascade amplifier as shown in FIG. 4 obtains the variable gain by varying V0 so as to change the route of current which flows into transistor Q0. Concretely, the amplification gain becomes low, when V0 is greater than V1, because the current flows via transistors Q2 and Q3 into transistor Q0, while the amplification gain becomes high, when V0 is smaller than V1, because the current flows via transistor Q1 into transistor Q0.

If the current of Q2 is smaller than the current of Q1, The gain becomes low, when V0 is greater than V1, while the gain becomes high, when V0 is smaller than V1.

FIG. 5 is a graph of a frequency characteristics of the conventional variable gain cascade amplifier as shown in FIG. 4. The cut off frequency at the high gain state is about 4 GHz, while the cut off frequency at the low gain state is about 1.5 GHz, as shown in FIG. 5.

As shown in FIG. 5, the cut off frequency at the high gain state is different from that at the low gain state, because the impedance of the base of transistor Q2 is high due to resistance R2 at higher frequency, and CR circuit by resistance R2 and parasitic capacitance C between the base and the collector of transistor Q2 limits the frequency characteristics. Therefore, the frequency characteristics varies, as the gain varies, in the conventional variable gain amplifier.

SUMMARY OF THE INVENTION

An object of the present invention is to provide a variable gain amplifier wherein the frequency characteristics is unchanged, when the gain is changed.

The variable gain amplifier of the present invention comprises an amplifying unit for amplifying an inputted signal and a variable gain unit for varying the gain of the amplifying unit. The variable gain unit includes a transistor and a parallel connection of a resistor and a capacitor connected with the transistor. The variable gain unit may includes a transistor and a parallel connection of a resistor and an inductance.

The impedance of the base of the transistor is lowered by the parallel connection of a resistance and a capacitor in higher frequency range.

The variable gain amplifier of the present invention are applied for various electronic appliances such as pocket telephones.

According to the variable gain amplifier of present invention, the frequency characteristics remain unchanged, because the impedance of the control electrode such as a base or a gate of amplifying transistor are made low in higher frequency range, by using a parallel connection of a resistance (or inductance) and a capacitance connected with the control electrode of the amplifying transistor.

PREFERRED EMBODIMENT OF THE INVENTION

Figure 1:
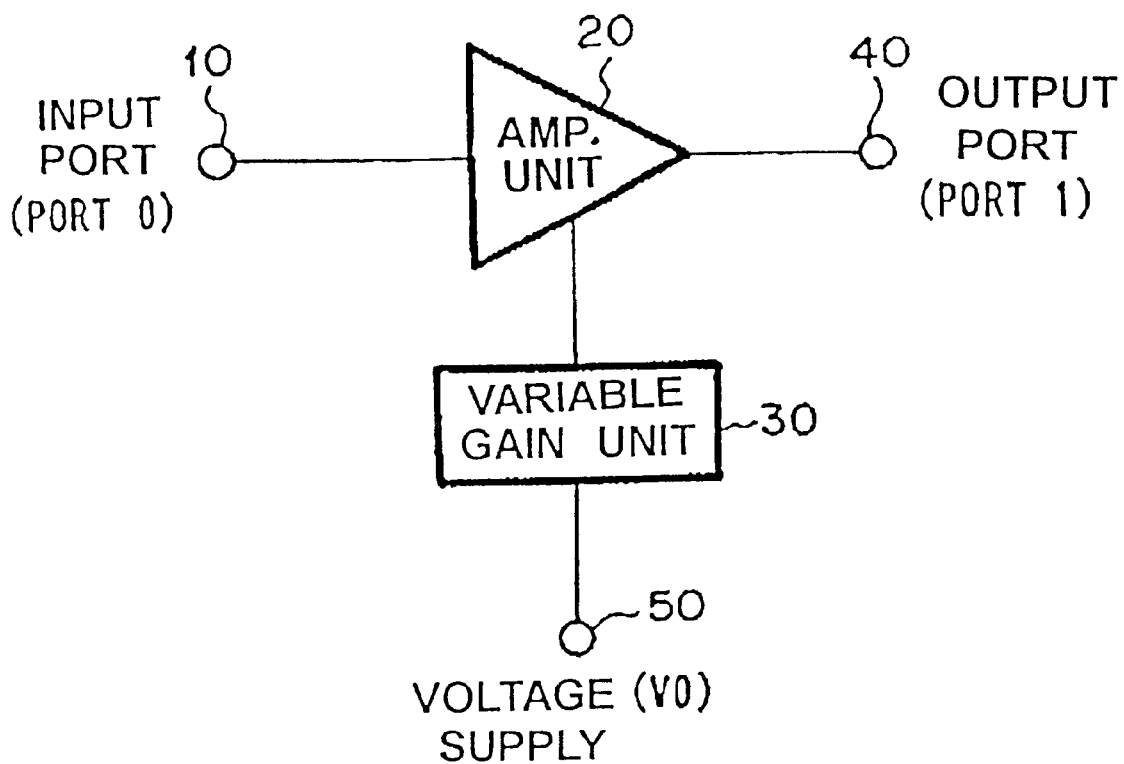
FIG. 1 is a block diagram of the variable gain amplifier of the present invention.

The embodiment of the present invention is explained, referring to the drawings.

FIG. 1 is a block diagram of the variable gain amplifier of the present invention. There are shown in FIG. 1 input port 10 (PORTO) for inputting a signal, amplifying unit for amplifying the signal from input port 10, variable gain unit 30 for varying the amplification gain of amplifying unit 20, voltage supply 50 (V0) for variable gain unit 30, and output port 40 for outputting the amplified signal.

Figure 2:
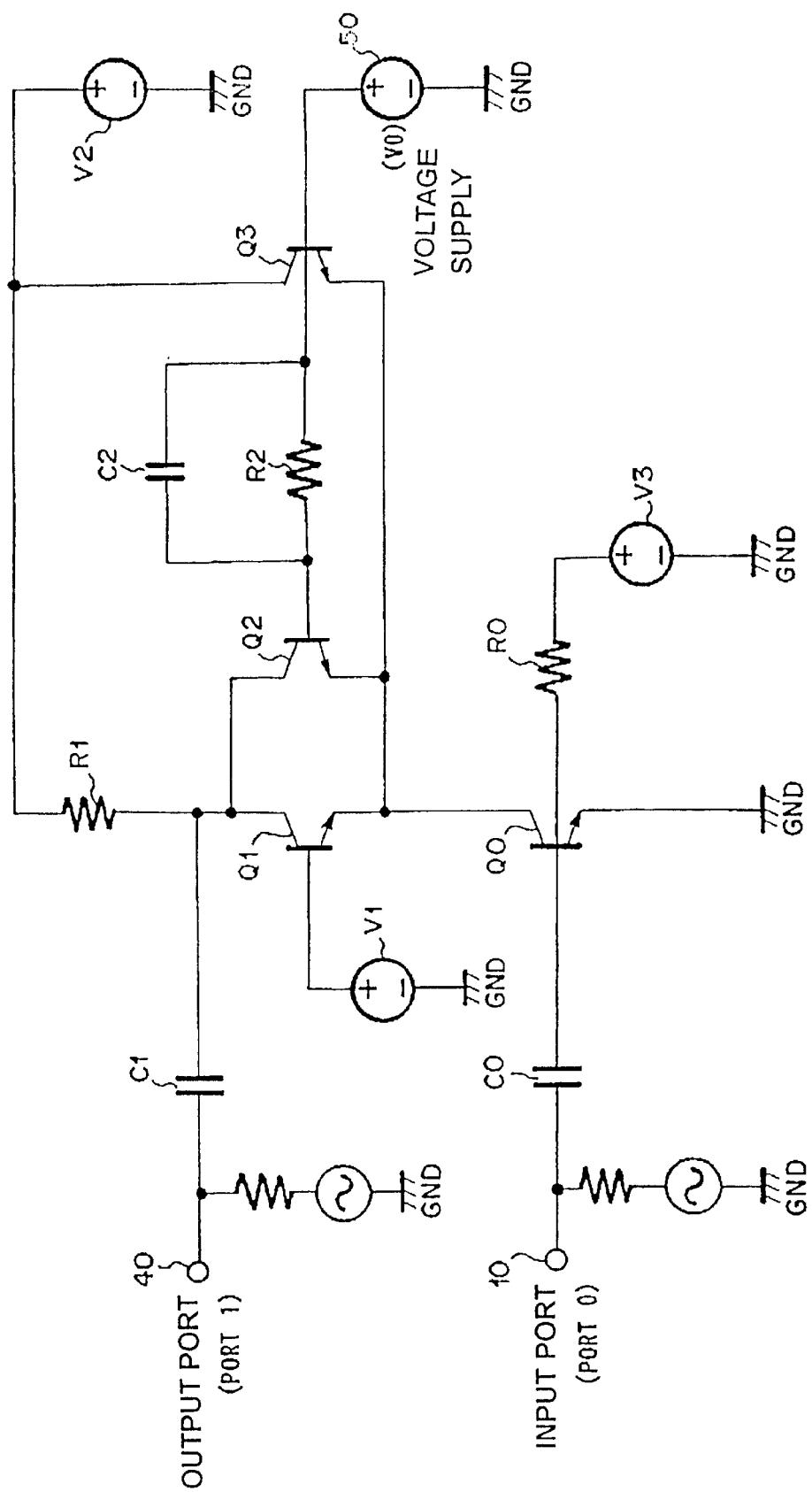
FIG. 2 is a circuit diagram of the variable gain amplifier of the present invention as shown in FIG. 1.

FIG. 2 is a circuit diagram of the variable gain amplifier as shown in FIG. 1. Amplifying unit 20 as shown in FIG. 1 is a cascade amplifier which includes common-emitter transistor Q0 and common base transistor Q1. Further, variable gain unit 30 as shown in FIG. 1 includes transistors Q2 and Q3, resistor R2 and capacitor C2.

There are shown in FIG. 2 resistance R0 for applying DC bias V3 to the base of transistor Q0, Resistor R1 as a load resistance for the cascade amplifier, voltage supply V1 for biasing the base of transistor Q1, voltage supply V2 for the variable gain amplifier of the present invention as a whole, input port 10, output terminal 40, and power supplies and coupling capacitors connected with input port 10 and output port 40.

Resistance R2 may be replaced by inductance L, and bipolar transistors may be replaced by other types such MOS transistors. The electrode for controlling the transistors are the bases of the bipolar transistors, or gates of the MOS transistors.

Resistance R2 gives a current feedback for transistor Q2, thereby lowering the mutual conductance "gm" of transistor Q2, and limiting the current flowing from voltage supply V0. The emitter area ratio (the emitter area of transistor Q2: the emitter area of Q3) made to be 1: n where "n" is greater than or equal to 1, thereby controlling each current.

Capacitor C2 is connected in parallel with R2 connected with the base of transistor Q2 is a bypass capacitor for lowering the impedance of the base of transistor Q2 in higher frequency range. Capacitor C2 is a peaking capacitor, because it improves the high frequency characteristics.

When voltage V0 becomes lower than voltage V1, transistors Q2 and Q3 are turned off, and therefore, the currents by voltage V2 do not flow through transistors Q2 and Q3. Accordingly, the current by voltage V2 flows through the cascade amplifier including transistors Q1 and Q0. In this case, the gain of the cascade amplifier is high.

The current of the cascade amplifier by voltage V2 flows through R1. The base of transistor Q1 is biased by voltage supply V1, while transistor Q2 is turned off. Therefore, the current flows through R1 and Q1 into transistor Q0.

Further, the current flowing into transistor Q0 flows into the earth (GND) connected with the emitter of transistor Q0, because transistor Q0 becomes a constant current DC current source due to the bias of its base. Therefore, when voltage Vo is lower than voltage V1, the signal inputted from PORT0 is amplified with the gain of the cascade amplifier itself. On the other hand, when voltage V0 is higher than voltage V1, transistors Q2 and Q3 are switched on, and the current by voltage V2 flows these transistors, but does not flow through the transistors Q1 and Q0. Therefore, the gain of the cascade amplifier including transistors Q1 and Q0 becomes low.

More concretely, when voltage V0 is greater than voltage V1, transistor Q3 is turned on by voltage V0, and the current by voltage V2 flows into transistor Q0 via transistor Q3. Further, the current through resistance R1 by voltage V2 flows also into transistor Q0 via transistor Q2, because transistor Q1 is turned off.

The current through transistor Q2 varies the gain of the cascade amplifier, because it depends upon the load current through load resistance R1 of the cascade amplifier. The current through transistor Q2 added to the current through Transistor Q3 becomes the current through transistor Q0.

Here, the current through transistor Q2 added to the current through transistor Q3 flows via transistor Q0 into the earth (GND) connected with the emitter of transistor Q0, because transistor Q0 becomes a constant current DC current source due to the bias of its base. Therefore, when voltage V0 is higher than voltage V1, the signal inputted from PORT0 is amplified with the gain controlled by the variable gain unit including transistors Q2 and Q3.

It is required that the current through Q2 is smaller than the current through Q1 in order to obtain the higher gain when V0 is lower than V1 and to obtain the lower gain when V0 is higher than V1.

Figure 3:
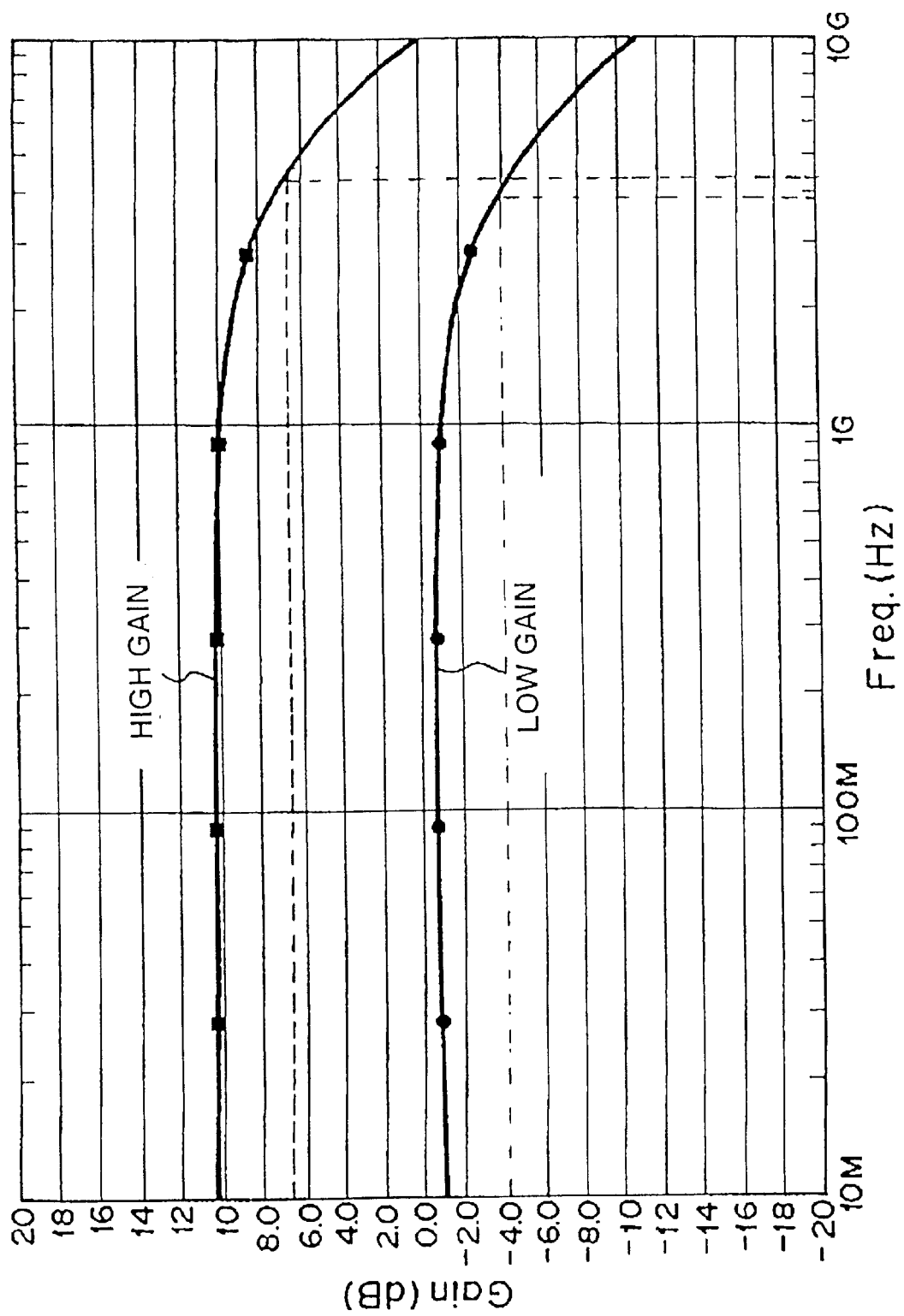
FIG. 3 is a graph for showing the cut off frequency of the variable gain amplifier of the present invention as shown in FIG. 2.
Figure 4:
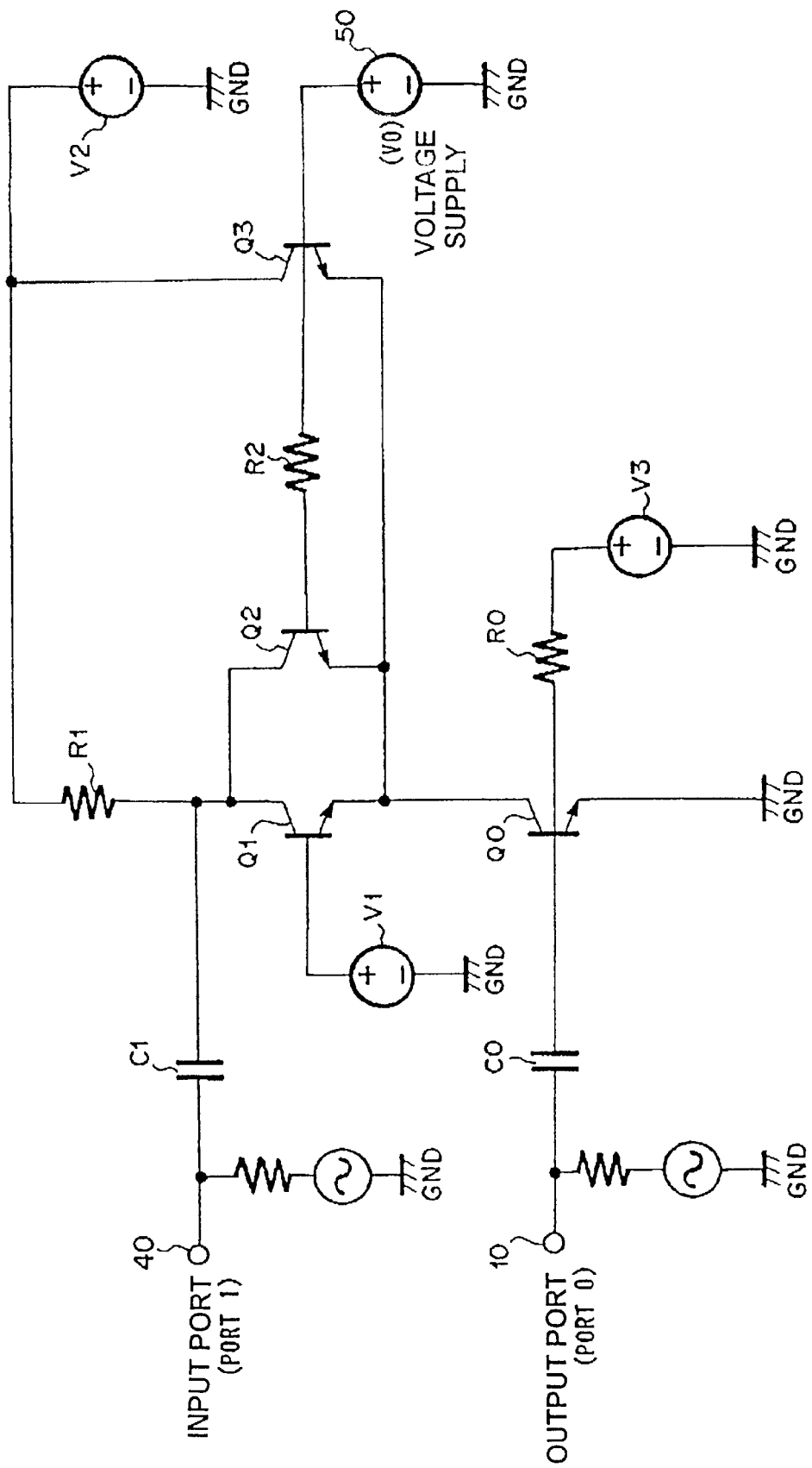
FIG. 4 is a block diagram of a conventional variable gain amplifier.
Figure 5:
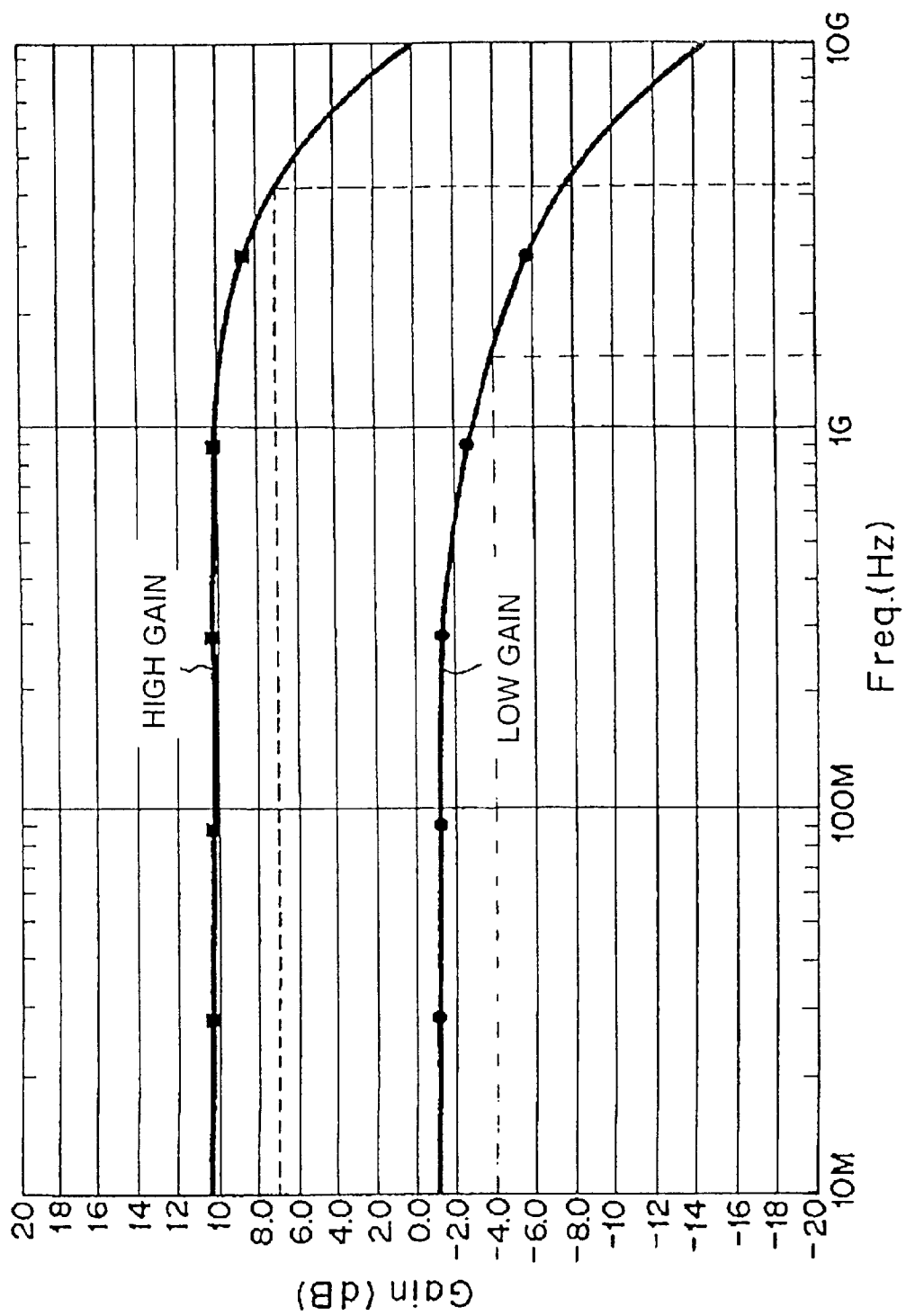
FIG. 5 is a graph for showing the cut off frequency of the conventional variable gain amplifier as shown in FIG. 4.

FIG. 3 is a graph of a frequency characteristic of the variable gain amplifier of the present invention as shown in FIG. 2. The cut off frequency is about 4 GHz both at the high gain and at the low gain, as shown in FIG. 3, thereby broadening the frequency characteristics regardless of the amplification gain.

The present invention is applicable to a low noise amplifier wherein an emitter of a common-emitter transistor is not connected with a resister, because the amplification gain is controlled by a base of a common-base transistor. Further, the present invention is applicable to a mixer, antenna switch.

Further, the variable gain amplifier of the present invention is applicable to a dual band pocket telephone suc as GSM (global system for mobile communication), because 800 MHz and 1.9 GHz signals are received by using a single amplifier.

What is claimed is:

1. A variable gain amplifier which comprises an amplifying unit for amplifying an inputted signal and a variable gain unit for varying a gain of said amplifying unit, wherein said variable gain unit includes a transistor provided with an electrode for control which is connected with a parallel connection of a capacitor and a resistor, or connected with a parallel connection of a capacitor and an inductance, wherein said gain is made high by turning off said variable gain unit, while said gain is made low by turning on said variable gain unit; and wherein a cut off frequency of said variable gain amplifier is unchanged, regardless of said gain.

2. The variable gain amplifier according to claim 1, wherein said amplifying unit comprises:

a first transistor Q1 which is turned on or off by said variable gain unit; and a second transistor Q0 which is connected in cascade with said first transistor Q1, and said variable gain unit comprises:

a third transistor Q2 connected with said transistor Q1;

a parallel connection of a capacitor and a resistor one of which end is connected with said transistor Q2, or a parallel connection of a capacitor and an inductance one of which end is connected with said transistor Q2; and a fourth transistor Q3 connected with another end of said parallel connection, wherein the current through said transistor Q2 is smaller than the current through said transistor Q1 and voltages V1 and V0 for on-off control are applied to said transistors Q1 and Q3, respectively, and wherein each of said transistors Q2 and Q3 is turned off when said voltage V1 is greater than said voltage V0, while each of said transistors Q2 and Q3 is turned on when said voltage V1 is smaller than said voltage V0.

3. The variable gain amplifier according to claim 2, wherein said transistor

Q1 and said transistor Q2 are bipolar transistors, wherein the collector of said transistor Q1 is connected with the collector of said transistor Q2, while the emitter of said transistor Q1 is connected with the emitter of said transistor Q2.

4. The variable gain amplifier according to claim 2, wherein said transistor Q1 and said transistor Q2 are MOS transistors, wherein the source of said transistor Q1 is connected with the source of said transistor Q2, while the drain of said transistor Q1 is connected with the drain of said transistor Q2.

5. The variable gain amplifier according to claim 2, wherein both of said transistor Q2 and said transistor Q3 are turned on or off by said voltage V0.

* * * * *